United States Patent
Maida et al.

(10) Patent No.: US 9,296,636 B2
(45) Date of Patent: Mar. 29, 2016

(54) TITANIA DOPED QUARTZ GLASS AND MAKING METHOD

(75) Inventors: Shigeru Maida, Joetsu (JP); Hisatoshi Otsuka, Joetsu (JP); Tetsuji Ueda, Koriyama (JP); Masanobu Ezaki, Koriyama (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 13/442,550

(22) Filed: Apr. 9, 2012

(65) Prior Publication Data

US 2012/0258389 A1 Oct. 11, 2012

(30) Foreign Application Priority Data

Apr. 11, 2011 (JP) ................. 2011-087099

(51) Int. Cl.
  *C03B 19/14* (2006.01)
  *C03C 3/06* (2006.01)
  *C03C 4/00* (2006.01)

(52) U.S. Cl.
  CPC ......... *C03B 19/1415* (2013.01); *C03B 19/1423* (2013.01); *C03C 3/06* (2013.01); *C03C 4/0085* (2013.01); *C03B 2201/42* (2013.01); *C03B 2207/64* (2013.01); *C03C 2201/42* (2013.01); *C03C 2203/42* (2013.01)

(58) Field of Classification Search
  CPC .. C03B 19/14; C03B 19/1423; C03B 2207/06
  USPC ......................................................... 65/17.4
  See application file for complete search history.

(56) References Cited

U.S. PATENT DOCUMENTS

| 4,367,085 A * | 1/1983 | Suto et al. ........................ 65/415 |
|---|---|---|
| 6,672,109 B1 | 1/2004 | Hiraiwa |
| 7,410,922 B2 | 8/2008 | Iwahashi et al. |
| 7,462,574 B2 | 12/2008 | Iwahashi et al. |
| 8,012,653 B2 | 9/2011 | Koike et al. |
| 8,105,734 B2 | 1/2012 | Maida et al. |
| 2005/0132749 A1 * | 6/2005 | Otsuka et al. .................. 65/17.4 |
| 2008/0292882 A1 | 11/2008 | Agata et al. |

(Continued)

FOREIGN PATENT DOCUMENTS

| EP | 1 795 506 A1 | 6/2007 |
|---|---|---|
| EP | 2 145 865 A1 | 1/2010 |

(Continued)

OTHER PUBLICATIONS

Machine translation of JP 2003-226544A. Original Document Publication Aug. 2003.*

(Continued)

*Primary Examiner* — Angela Ortiz
*Assistant Examiner* — Cynthia Szewczyk
(74) *Attorney, Agent, or Firm* — Westerman, Hattori, Daniels & Adrian, LLP (57) ABSTRACT

On an EUV light-reflecting surface of titania-doped quartz glass, an angle (θ) included between a straight line connecting an origin (O) at the center of the reflecting surface to a birefringence measurement point (A) and a fast axis of birefringence at the measurement point (A) has an average value of more than 45 degrees. Since fast axes of birefringence are distributed in a concentric fashion, a titania-doped quartz glass substrate having a high flatness is obtainable which is suited for use in the EUV lithography.

2 Claims, 6 Drawing Sheets

(56) References Cited

U.S. PATENT DOCUMENTS

| | | |
|---|---|---|
| 2008/0305940 A1 | 12/2008 | Maida et al. |
| 2009/0122281 A1 | 5/2009 | Iwahashi et al. |
| 2010/0003609 A1* | 1/2010 | Maida et al. ............ 430/5 |
| 2010/0028787 A1 | 2/2010 | Koike et al. |

FOREIGN PATENT DOCUMENTS

| | | | |
|---|---|---|---|
| EP | 2 426 091 A1 | | 3/2012 |
| JP | 08-333125 A | | 12/1996 |
| JP | 2003226544 A | * | 8/2003 |
| JP | 2004-315351 A | | 11/2004 |
| JP | 2005-022954 A | | 1/2005 |
| JP | 2005-104820 A | | 4/2005 |
| JP | 2007-223888 A | | 9/2007 |
| JP | 2010-013335 A | | 1/2010 |
| JP | 2010-135732 A | | 6/2010 |
| WO | 00/64826 A1 | | 11/2000 |
| WO | 2004/089836 A1 | | 10/2004 |
| WO | 2004/089838 A1 | | 10/2004 |
| WO | 2004/089839 A1 | | 10/2004 |
| WO | 2011/021609 A1 | | 2/2011 |

OTHER PUBLICATIONS

Extended European Search Report dated Aug. 8, 2012, issued in corresponding European Patent Application No. 12163818.3 (11 pages).

* cited by examiner

MEASUREMENT POINT
(9 POINTS)

FIG.10B

TITANIA DOPED QUARTZ GLASS AND MAKING METHOD

CROSS-REFERENCE TO RELATED APPLICATION

This non-provisional application claims priority under 35 U.S.C. §119(a) on Patent Application No. 2011-087099 filed in Japan on Apr. 11, 2011, the entire contents of which are hereby incorporated by reference.

TECHNICAL FIELD

This invention relates to titania-doped quartz glass suited for use in the EUV lithography, and a method for manufacturing the glass.

BACKGROUND ART

In the advanced lithography process for the fabrication of semiconductor devices, a light source of shorter wavelength is used for exposure. A subsequent transition to lithography using extreme ultraviolet (EUV) is regarded promising.

Since the EUV lithography uses a reflecting optical system, the lithography accuracy can be adversely affected even by a slight thermal expansion of each member (e.g., substrate) in the lithographic optical system induced by the heat that has reached there. Accordingly, members like reflecting mirrors, masks, and stages must be made of low expansion materials. Titania-doped quartz glass is known as a typical low expansion material. The addition of a certain amount of titania makes it possible to minimize the thermal expansion of quartz glass.

The EUV lithography members, especially photomask-forming substrates are required to be fully flat. Specifically, photomask substrates must have a flatness of up to 50 nm in the practical application, and an even high flatness of up to 30 nm for the fabrication of finer patterns, within a central region of 142 mm×142 mm squares.

However, it is difficult to manufacture substrates having a high flatness from titania-doped quartz glass when the glass has a non-uniform titania concentration. When a glass substrate having a non-uniform titania concentration is polished, the substrate surface becomes irregular due to varying reactivity with the polishing slurry and differential polishing speed. In this regard, JP-A 2004-315351, JP-A 2005-104820, and JP-A 2005-022954, for example, disclose titania-doped quartz glass having a narrow titania concentration distribution useful as EUV lithographic members.

JP-A 2010-013335 describes that the refractive index distribution of titania-doped quartz glass is determined by taking into account the polishing mechanism so that high-flatness substrates may be readily manufactured therefrom.

During manufacture of titania-doped quartz glass, zones having a non-uniform titania concentration, known as striae, may be formed in a direction perpendicular to the growth direction of titania-doped quartz glass, due to temperature variations at the growth face, variations of the reactant gas composition, and other variations. Striae are variations of titania concentration at intervals of several microns to several millimeters, and structurally strained sites are present within the stria. Since strained sites within titania-doped quartz glass are structurally unstable, abrasion selectively occurs thereat during polishing, leading to aggravated flatness.

Based on the discovery that striae-strained sites are converted into numerical values of stress, JP-A 2010-135732 proposes the stress level permissible as EUV lithographic members and the method of reducing the stress.

CITATION LIST

Patent Document 1: JP-A 2004-315351
Patent Document 2: JP-A 2005-104820 (WO 2004/089836)
Patent Document 3: JP-A 2005-022954 (WO 2004/089839)
Patent Document 4: JP-A 2010-013335 (U.S. Pat. No. 8,105,734, EP 2145865)
Patent Document 5: JP-A 2010-135732 (U.S. Pat. No. 8,012,653)
Patent Document 6: JP-A H08-333125

SUMMARY OF INVENTION

An object of the invention is to provide a titania-doped quartz glass having a high flatness and suited for use in the EUV lithography, and a method for preparing the same.

Regarding titania-doped quartz glass for use as EUV lithographic members, the inventors found that the titania concentration distribution of titania-doped quartz glass must be uniform in order to produce a substrate which can be polished to a high flatness, and that mere control of striae is sometimes difficult to obtain a high-flatness polished substrate for use as EUV lithographic members. The inventors have found that for the surface of titania-doped quartz glass where EUV light is reflected, when an angle (θ) included between a straight line connecting an origin (O) at the center of the reflecting surface to a birefringence measurement point (A) and a fast axis of birefringence at the measurement point (A) has an average value of more than 45 degrees, the fast axes of birefringence in the EUV light-reflecting surface are distributed in a concentric fashion. Thus titania-doped quartz glass having a high flatness is obtainable.

In a first aspect, the invention provides a titania-doped quartz glass having a surface where EUV light is reflected, wherein an angle (θ) included between a straight line connecting an origin (O) at the center of the reflecting surface to a birefringence measurement point (A) and a fast axis of birefringence at the measurement point (A) has an average value of more than 45 degrees.

In a preferred embodiment, birefringence in the EUV light-reflecting surface has a standard deviation of less than or equal to 5 nm/cm. Also preferably, the birefringence in the EUV light-reflecting surface has a maximum of less than or equal to 10 nm/cm.

In a preferred embodiment, the titania-doped quartz glass has a fictive temperature distribution of less than or equal to 20° C. Also preferably, the titania-doped quartz glass has a fictive temperature of lower than or equal to 850° C.

In a second aspect, the invention provides an EUV lithographic member comprising the titania-doped quartz glass defined above.

Typically the EUV lithographic member is an EUV lithographic photomask substrate. In a preferred embodiment, the substrate has front and back surfaces, either one of which has a flatness of less than or equal to 50 nm in a central region of 142 mm×142 mm squares. More preferably, both the front and back surfaces have a flatness of less than or equal to 50 nm in a central region of 142 mm×142 mm squares.

In a third aspect, the invention provides a method for manufacturing a titania-doped quartz glass, comprising the steps of subjecting a feed of a silicon-providing reactant gas and a titanium-providing reactant gas to oxidation or flame hydrolysis with the aid of a combustible gas and a combustion-supporting gas, to form synthetic silica-titania fine particles, depositing the silica-titania fine particles on a rotating target, and concurrently melting and vitrifying the particles to form a titania-doped quartz glass ingot. During the ingot formation, the molten face of the ingot is maintained in an oblong shape having a major axis aligned with the growth axis direction of the ingot.

In a preferred embodiment, a molten face sector of the ingot has a length "a" in the growth axis direction of the ingot and a radius "b" in a radial direction of the ingot perpendicular to the growth axis direction, which meet the relationship: $0.3<1-(b/a)<0.67$.

In a fourth aspect, the invention provides a method for manufacturing a titania-doped quartz glass using a horizontal furnace comprising a burner, the burner comprising a central multi-fold tube section including at least three tubes, a reactant gas injecting central tube, a first combustion-supporting gas feed tube outside the central tube, and a first combustible gas feed tube outside the first combustion-supporting gas feed tube, and a multi-nozzle section including a first shell tube enclosing the central multi-fold tube section, a second shell tube enclosing the first shell tube, and a plurality of combustion-supporting gas feed tubes disposed inside the first and second shell tubes, the spaces surrounding the combustion-supporting gas feed tubes serving as combustible gas feeder. The method comprises the steps of subjecting a silicon-providing reactant gas and a titanium-providing reactant gas to oxidation or flame hydrolysis with the aid of a combustible gas and a combustion-supporting gas, to form silica and titania fine particles, depositing the silica and titania fine particles on a rotating target, concurrently melting and vitrifying the particles to form a titania-doped quartz glass ingot. The silicon-providing reactant gas, the titanium-providing reactant gas, and the combustion-supporting gas are fed through the reactant gas injecting central tube in such amounts that the titania-doped quartz glass may have a titania content of 3 to 10% by weight. The combustible gas is fed at a linear velocity of less than or equal to 100 m/sec. The combustible gas and the combustion-supporting gas are fed in such amounts that a $H_2/O_2$ ratio may fall in the range: $1.7 \leq H_2/O_2 < 2$. The flow rates of the combustible gas, the combustion-supporting gas, the silicon-providing reactant gas, and the titanium-providing reactant gas each are controlled within a variation of ±1%. The temperatures of air fed into the furnace for cooling, exhaust gas taken out of the furnace, and ambient air surrounding the furnace each are controlled within a variation of ±2.5° C. The distance between the burner and the ingot growth face is 250 to 330 mm. The angle included between the ingot growth axis and the axis of the reactant gas injecting tube of the burner is 126° to 140°. The target is rotated at a speed of 5 to 200 rpm without relative oscillation of the burner and the target and without oscillation of the ingot in a plane perpendicular to the growth axis direction. The method further comprises the steps of hot shaping the ingot, slicing the ingot to a predetermined thickness, and annealing at a cooling rate of 1 to 20° C. to or below 300° C.

Advantageous Effects of Invention

Since fast axes of birefringence are distributed in a concentric fashion, a titania-doped quartz glass having a high flatness is obtainable which is suited for use in the EUV lithography, especially as EUV lithographic photomasks.

BRIEF DESCRIPTION OF DRAWINGS

FIG. 10 illustrates a burner system used in Comparative Example 2, FIG. 10*a* being a schematic view of the overall system and FIG. 10*b* being a transverse section of the oxyhydrogen flame burner.

DESCRIPTION OF EMBODIMENTS

EUV lithographic members, especially photomask substrates are required to have a high flatness. Prior art approaches taken to achieve a high flatness include control of unevenness of titania concentration distribution, consideration of refractive index distribution, and control of stresses within titania-doped quartz glass caused by striae, as described in the above-cited documents.

However, the flatness required for the EUV lithographic members is at a very high level. Specifically, photomask substrates must have a flatness of up to 50 nm in the practical application, and an even high flatness of up to 30 nm for the fabrication of finer patterns, within a central region of 142 mm×142 mm squares. The approaches including control of unevenness of titania concentration distribution, consideration of refractive index distribution, and control of stresses within titania-doped quartz glass caused by striae are not always successful in producing EUV lithographic members having a high level of flatness. The inventors have found that a concentric distribution of fast axes of birefringence within the EUV light-reflecting surface is effective for obtaining a photomask substrate having a higher flatness.

Birefringence occurs when light passes through titania-doped quartz glass, and refers to a difference between light transmission velocities due to different refractive indices dependent on the orientation of vibration planes. The transmission velocity (v) of light follows the equation (1):

$$v=c/n \qquad (1)$$

wherein c is a velocity of light in vacuum and n is a refractive index. Herein, the orientation corresponding to the highest transmission velocity of light, that is, the lowest refractive index is referred to as "fast axis."

Although a relationship of the distribution of fast axes of birefringence in the EUV light-reflecting surface of titania-doped quartz glass to the flatness of the polished surface thereof is indefinite, the bond network and OH group in titania-doped quartz glass are slightly oriented depending on the direction of fast axis. Additionally, the polishing step is taken into account. If the distribution of fast axes of birefringence in the EUV light-reflecting surface is made concentric, then a titania-doped quartz glass substrate having a high flatness and suitable for use in the EUV lithography is readily obtainable.

Figure 1:
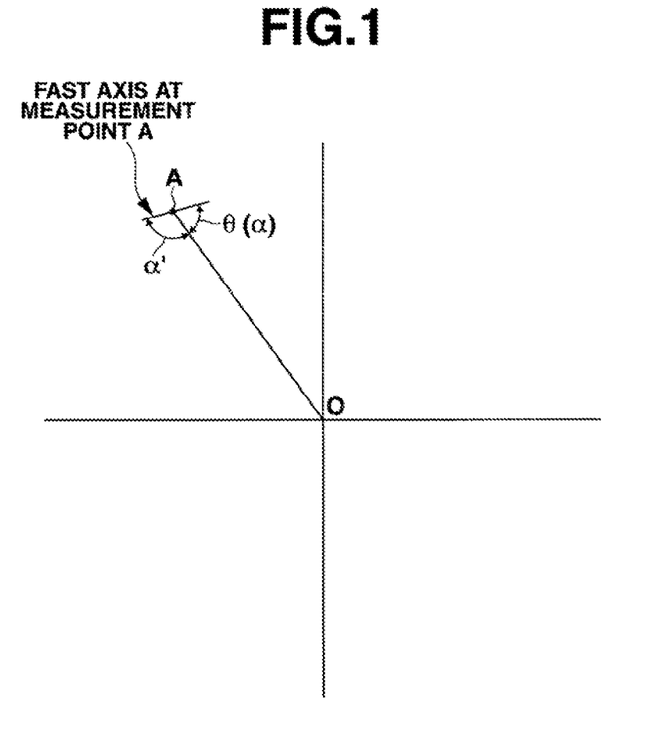
FIG. 1 diagrammatically illustrates how to define an angle (θ) at birefringence measurement point (A).

In the inventive titania-doped quartz glass having a surface where EUV light is reflected, as shown in FIG. 1, an angle (θ=α) included between a straight line connecting an origin (O) at the center of the reflecting surface to a birefringence measurement point (A) and a fast axis of birefringence at the measurement point (A) has an average value of more than 45 degrees (°), preferably at least 60°, more preferably at least 70°, and even more preferably at least 80°. The angle (θ) included between a straight line connecting an origin (O) at the center of the EUV light-reflecting surface to a birefringence measurement point (A) and a fast axis of birefringence at the measurement point (A) has an average value of 90° at the maximum. If this angle (θ) is less than the range, then a titania-doped quartz glass substrate suitable for use in the EUV lithography may be obtainable with difficulty.

Referring to FIG. 1, the angle (θ) at each birefringence measurement point is described in detail. An origin (O) is at the center of the EUV light-reflecting surface of titania-doped quartz glass. A point of birefringence measurement is designated at "A." Angles α and α' are defined between a straight line connecting the origin (O) to the measurement point (A) and a fast axis of birefringence at the measurement point (A). Of the angles α and α', the smaller one is assigned as the angle (θ) at the birefringence measurement point (A). This implies θ=α in FIG. 1. If angle α is equal to angle α', then θ=α=α'=90°. The angle (θ) is 0≤θ≤90°. It is noted that the fast axis at the origin (O) is ignored. The means for adjusting the angle (θ) in the range will be understood from the description of the method for controlling the birefringence fast axis distribution.

In a preferred embodiment, on the EUV light-reflecting surface of the titania-doped quartz glass, the angle (θ) included between the straight line connecting the origin (O) at the center of the reflecting surface to the birefringence measurement point (A) and the fast axis of birefringence at the measurement point (A) has a standard deviation of less than or equal to 20°, more preferably less than or equal to 15°, and even more preferably less than or equal to 10°. If the standard deviation of the angle (θ) is greater than the range, then a titania-doped quartz glass substrate having a high flatness and suitable for use as the EUV lithography member may be obtainable with difficulty. The standard deviation is at least 0.01° though the lower limit is not critical. The means for adjusting the standard deviation of the angle (θ) to or below 20° will be understood from the description of the method for controlling the birefringence fast axis distribution.

It is noted that birefringence can be measured on titania-doped quartz glass (whose opposite surfaces have been polished and cleaned) by an optical heterodyne birefringence meter of Uniopto Corp. or Exicor 350AT of Hinds Instruments, Inc. at a measurement wavelength of 633 nm. Herein, birefringence is measured on a glass sample having opposite surfaces polished to mirror finish. For more accurate measurement, measurement points are preferably spaced apart 1 cm or less although the spacing depends on the size of a titania-doped quartz glass sample to be tested. On measurement, birefringence and the direction of fast axis are measured.

Described below is the method for controlling the distribution of fast axis of birefringence in the EUV light-reflecting surface of titania-doped quartz glass.

Figure 2:
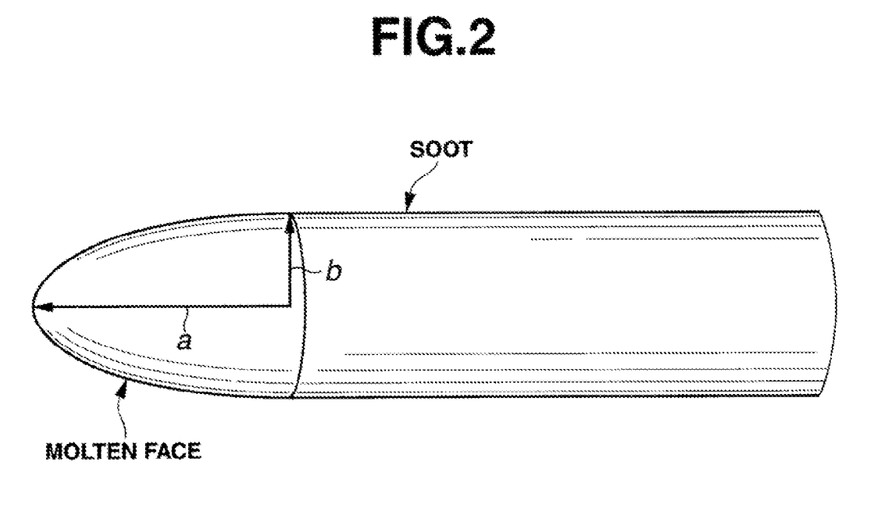
FIG. 2 schematically illustrates the growth site during manufacture of a titania-doped quartz glass ingot according to the invention.

FIG. 2 schematically illustrates the growth site during manufacture of a titania-doped quartz glass ingot according to the invention. The molten face is the site where the ingot surface is kept in the molten state by oxyhydrogen flame from a quartz glass manufacturing burner. Since the temperature lowers with the growth of the ingot, the ingot surface changes from the molten state to the state that porous silica or soot has deposited on the surface of titania-doped quartz glass. It is now assumed that a molten face sector of the ingot has a length "a" in the growth axis direction of the ingot and a radius "b" in a radial direction of the ingot perpendicular to the growth axis direction. In the embodiment of the invention wherein for the EUV light-reflecting surface of titania-doped quartz glass, an angle (θ) included between a straight line connecting an origin (O) at the center of the reflecting surface to a birefringence measurement point (A) and a fast axis of birefringence at the measurement point (A) has an average value of more than 45°, and in the preferred embodiment wherein for the EUV light-reflecting surface of titania-doped quartz glass, an angle (θ) included between a straight line connecting an origin (O) at the center of the reflecting surface to a birefringence measurement point (A) and a fast axis of birefringence at the measurement point (A) has a standard deviation of less than or equal to 20°, it is recommended that during the manufacture of titania-doped quartz glass, the molten face of the ingot is maintained in an oblong shape having a major axis aligned with the growth axis direction of the ingot.

It is further preferred that length "a" and radius "b" in FIG. 2 meet the relationship: $0.3<1-(b/a)<0.67$, more preferably $0.4<1-(b/a)<0.55$. If $1-(b/a)\geq 0.67$, the molten face sector may become larger and the ingot growth site may reduce its viscosity, with a likelihood of the ingot becoming eccentric during its manufacture. If the ingot becomes eccentric, the titania concentration distribution within the ingot becomes broader, with a likelihood of striae formation. If $1-(b/a)\leq 0.3$, it may be difficult to ensure that the birefringence fast axis distribution in the EUV light-reflecting surface of titania-doped quartz glass is concentric. Although the reason why the birefringence fast axis distribution in the EUV light-reflecting surface of titania-doped quartz glass becomes concentric when the shape of the molten face is maintained oblong or to meet the above relationship is not clearly understood, it is presumed that the positional relation between the glass manufacturing burner and the target (or ingot), the balance between the reactant gases and oxyhydrogen flame, and the temperature state of the ingot growth site are pertinent.

In addition to the above requirements, it is preferred that the birefringence in the EUV light-reflecting surface of titania-doped quartz glass have a standard deviation of less than or equal to 5 nm/cm, more preferably less than or equal to 3 nm/cm, and even more preferably less than or equal to 2 nm/cm. Even in the embodiment wherein the birefringence fast axis distribution in the EUV light-reflecting surface of titania-doped quartz glass is concentric, if the standard deviation of birefringence is greater, then it may be difficult to obtain a titania-doped quartz glass member having a high flatness suited for the EUV lithography.

It is also preferred that the birefringence in the EUV light-reflecting surface of titania-doped quartz glass have a maximum of less than or equal to 10 nm/cm, more preferably less than or equal to 5 nm/cm. Even in the embodiment wherein the standard deviation of birefringence in the EUV light-reflecting surface is controlled low, if there are sites having a high birefringence, then the flatness of a titania-doped quartz glass member may be aggravated. The birefringence is typically at least 0.01 nm/cm though the lower limit is not critical. The means for controlling birefringence and the standard deviation of birefringence in the above-defined ranges may include the steps of hot shaping and annealing and slow cooling a quartz glass ingot to be described later, for example.

Further preferably, the titania-doped quartz glass has a fictive temperature distribution of less than or equal to 20° C., more preferably less than or equal to 10° C., and even more preferably less than or equal to 5° C. If the fictive temperature distribution is broader, there may be a distribution of thermal expansion properties within titania-doped quartz glass, which may be unsuitable for use as EUV lithographic members. The fictive temperature distribution of the titania-doped quartz glass is typically at least 0.1° C. though the lower limit is not critical.

Further preferably, the titania-doped quartz glass has a fictive temperature of lower than or equal to 850° C., more preferably lower than or equal to 800° C., even more preferably lower than or equal to 775° C., and most preferably lower than or equal to 770° C. Since the temperature range where the glass exhibits low thermal expansion becomes broader as the fictive temperature lowers, the titania-doped quartz glass having a lower fictive temperature is suitable as optical members in a EUV lithography exposure tool for mass-scale manufacture which are expected to encounter higher temperatures. The fictive temperature of the titania-doped quartz glass is typically at least 500° C. though the lower limit is not critical.

The means for controlling the fictive temperature and the fictive temperature distribution in the above-defined ranges include the step of controlling the angle $\alpha''$ of a burner (in FIG. 4) used in the manufacture of titania-doped quartz glass in the predetermined range, and the step of annealing and slow cooling an ingot to be described later.

The fictive temperature of titania-doped quartz glass can be measured by a laser Raman spectrophotometer. A difference in fictive temperature reveals itself as a difference in peak intensity ratio of the $\omega 3$ band (near 800 cm$^{-1}$) of Si—O to the D2 band (near 600 cm$^{-1}$) assigned to the 3-membered ring structure of silica. The procedure involves measuring a Raman spectrum of a fictive temperature standard sample of titania-doped quartz glass, determining a $\omega 3$/D2 ratio therefrom, plotting the ratio versus the fictive temperature of the standard sample to draw a calibration curve, and determining the fictive temperature of a sample whose fictive temperature is unknown, using the calibration curve.

A fictive temperature standard sample of titania-doped quartz glass may be prepared by heating a titania-doped quartz glass piece at a constant temperature for a long period of time sufficient for structural relaxation to proceed, then quenching the piece as by instantaneously moving the piece from the constant temperature furnace into liquefied nitrogen, for thereby instantaneously freezing the structure. In this way, a fictive temperature standard sample in which the structure at the heating temperature is frozen can be prepared. For example, a standard sample prepared as above under the condition that the heating temperature is 1,000° C. has a fictive temperature of 1,000° C. The titania concentration of the fictive temperature standard sample is preferably equivalent to that of a sample to be measured.

For the purpose of effectively lowering the fictive temperature, the titania-doped quartz glass should preferably have an OH group concentration of 300 to 700 ppm, more preferably 400 to 600 ppm on average. The distribution of OH group concentration in the EUV light-reflecting surface of titania-doped quartz glass is not particularly restricted since it is not essential for gaining a concentric distribution of birefringence fast axis, but the preferred distribution is that the OH group concentration increases from the center toward the periphery of the reflecting surface in a concentric fashion. If titania-doped quartz glass subject to annealing and slow cooling is thick, and if the cooling rate is high, then a peripheral portion of titania-doped quartz glass is cooled more quickly than a central portion, and so the peripheral portion tends to have a higher fictive temperature, resulting in a greater fictive temperature distribution of titania-doped quartz glass. Since a high OH group concentration is expected effective for further lowering the fictive temperature, it is preferred for eventually reducing the fictive temperature distribution.

The means for controlling the OH group concentration in the above-defined range is not particularly limited although it is preferred to employ the direct method of forming a titania-doped quartz glass ingot involving feeding a hydrogen-containing combustible gas and an oxygen-containing combustion-supporting gas to a burner, burning the gases to form an oxyhydrogen flame at the burner tip, feeding a silicon-providing reactant gas and a titanium-providing reactant gas into the oxyhydrogen flame for subjecting the silicon-providing reactant gas and the titanium-providing reactant gas to oxidation or flame hydrolysis, depositing the resulting fine particles of silicon oxide, titanium oxide and composite thereof on a target disposed in front of the burner tip, and letting titania-doped quartz glass grow on the target, and especially to implement the method in a horizontal furnace. This is because the indirect method tends to provide a low OH group concentration and the direct method in a vertical furnace tends to provide a high OH group concentration.

An OH group concentration of titania-doped quartz glass may be measured by an infrared spectrophotometer FT/IR-300E (JASCO Corp.). Specifically, an absorption spectrum is measured in a region of 3000 to 5000 cm$^{-1}$ at a resolving power of 2 cm$^{-1}$ and an integration count of 20, the peaks at 4762 cm$^{-1}$ and 4202 cm$^{-1}$ are connected to draw a straight line, which serves as the base line, then the peak height near 4522 cm$^{-1}$ gives an absorption coefficient. An OH group concentration is determined in accordance with the equation (2):

$$\text{OH group concentration(ppm)} = \{(\text{absorption coefficient at } 4522 \text{ cm}^{-1})/T\} \times 4400 \qquad (2)$$

wherein T is a thickness (cm) of a sample.

In another preferred embodiment, the titania-doped quartz glass has an absorption edge wavelength at an apparent transmittance per 5-mm thickness, and a distribution of the absorption edge wavelength is less than or equal to 10 nm, more preferably less than or equal to 5 nm, and even more preferably less than or equal to 3 nm. The distribution of absorption edge wavelength at an apparent transmittance per 5-mm thickness is typically at least 0.001 nm, more preferably at least 0.01 nm, though the lower limit is not critical. On use of titania-doped quartz glass having a broader distribution of the absorption edge wavelength at an apparent transmittance per 5-mm thickness, the member undergoes substantial changes of its shape and physical properties together with thermal hysteresis, which are considered serious in the practice of EUV lithography.

The means for ensuring that the distribution of absorption edge wavelength at an apparent transmittance per 5-mm thickness is up to 10 nm may include the use of a specific burner, to control the burner angle $\alpha''$ within the predetermined range, and to set the amounts of oxygen and hydrogen gases used within the predetermined ranges, to be described later.

In a further preferred embodiment of the titania-doped quartz glass, the absorption edge wavelength at an apparent transmittance per 5-mm thickness is longer than or equal to 270 nm, more preferably longer than or equal to 275 nm, and even more preferably longer than or equal to 277 nm. If the absorption edge wavelength at an apparent transmittance per 5-mm thickness is shorter than 270 nm, then a low thermal expansion necessary as the EUV lithography member may be least available. In the preferred embodiment of the titania-doped quartz glass, the absorption edge wavelength at an apparent transmittance per 5-mm thickness is shorter than or equal to 320 nm. If the absorption edge wavelength at an apparent transmittance per 5-mm thickness is longer than 320 nm, then too much titania fine grains may form in titania-doped quartz glass.

The means for ensuring that the absorption edge wavelength falls in the range of 270 nm to 320 nm may include the use of a specific burner, to control the burner angle α" within the predetermined range, and to set the amounts of oxygen and hydrogen gases used within the predetermined ranges, to be described later.

In a further preferred embodiment of the titania-doped quartz glass, the apparent transmittance per 5-mm thickness at a wavelength of 350 to 800 nm is at least 70%, more preferably at least 80%, and even more preferably at least 90%. If the apparent transmittance per 5-mm thickness at a wavelength of 350 to 800 nm is less than 70%, such a low transmittance may interfere with alignment and quality inspection of the member, which is inadequate for the EUV lithography member requiring accurate alignment and inspection. A drop of transmittance in the visible range due to the presence of reducing species in titania-doped quartz glass also has an impact on the absorption edge wavelength. The apparent transmittance per 5-mm thickness at a wavelength of 350 to 800 nm is typically up to 95% when a loss of transmittance due to surface reflection is taken into account, though the upper limit is not critical.

The means for controlling the apparent transmittance within the above-defined range may include to control the linear velocity of combustible gas within the predetermined range.

As used herein, the term "absorption edge wavelength" refers to an average wavelength which is determined by providing a titania-doped quartz glass sample of 5 mm thick which has been precision polished and cleaned on both surfaces, measuring 5 times an apparent transmittance of the glass sample in the visible-UV spectrum, and averaging the wavelengths at which the apparent transmittance is less than or equal to 1%. Transmittance measurement is performed by a transmittance meter, specifically VARIAN Cary 400 spectrophotometer, under the following conditions.

Light source: heavy hydrogen lamp
Averaging time: 1.0 sec
Data interval: 0.083 nm
Scan rate: 4.98 nm/min
SBW: 3.0 nm
Measurement wavelength range: 330-260 nm It is noted that when the apparent transmittance at a wavelength of 350 to 800 nm is measured, measurement is performed under the same conditions as above aside from changing the measurement wavelength range to 350 to 800 nm.

The sample for apparent transmittance measurement is provided by lapping a quartz glass sample on a double-side lapping machine Model 12B (Fujikoshi Machinery Corp.) with a suede-type lapping pad and a cerium oxide abrasive slurry until the thickness of the sample reaches 5 mm±20 µm. This is followed by lapping for a further 1 hour with colloidal silica as the lapping slurry, and cleaning.

The titania-doped quartz glass should preferably have a titania content of 3 to 10% by weight, more preferably 5 to 9% by weight in order that the glass undergo low thermal expansion in the exposure temperature range of the EUV lithography. The titania content is measured by electron probe microanalysis (EPMA) using a probe with a diameter of 10 µm. Computation is made on the assumption that all titanium detected is present as titania ($TiO_2$).

According to the invention, titania-doped quartz glass may be prepared by feeding a combustible gas containing hydrogen and a combustion-supporting gas containing oxygen to a burner built in a quartz glass-manufacturing furnace, burning the gases to form an oxyhydrogen flame at the burner tip, feeding a silicon-providing reactant gas and a titanium-providing reactant gas through the burner into the flame for subjecting the reactant gases to oxidation or flame hydrolysis to thereby form silica, titania and composite fine particles, depositing the fine particles on a rotating target disposed forward of the burner, and concurrently melting and vitrifying the deposited particles to grow titania-doped quartz glass to form an ingot, hot shaping the ingot into a predetermined shape, and annealing and slowly cooling the shaped ingot.

The quartz glass-manufacturing furnace is preferably of horizontal type. If a furnace of vertical type is used, the molten face sector of an ingot being manufactured may not take an oblong shape having a major axis aligned with the growth axis direction of the ingot, and as a result, the birefringence fast axis distribution may not become concentric. Also, the target of a seed or similar material is typically rotated at a rotational speed of at least 5 rpm, preferably at least 15 rpm, and more preferably at least 30 rpm. The upper limit of rotational speed of the target is typically 200 rpm. This is because striae, strains or structurally or compositionally non-uniform zones generate, depending largely on the unevenness of temperature in a portion where titania-doped quartz glass grows on the rotating target. Then the generation of structurally or compositionally non-uniform zones in titania-doped quartz glass can be inhibited by increasing the rotational speed of the target so that an even temperature may be available in a portion where titania-doped quartz glass grows.

In the method for the manufacture of the titania-doped quartz glass, the burner and the target should not be relatively oscillated during manufacture of an ingot. Otherwise, the birefringence fast axis distribution may not be concentric, the titania concentration distribution in the ingot may be broadened, strong striae may be generated, and for these reasons, it is difficult to obtain a EUV lithography member having a high surface flatness.

The generation of structurally or compositionally non-uniform zones in titania-doped quartz glass can also be inhibited by supplying the silicon-providing reactant gas and the titanium-providing reactant gas through a common nozzle of the burner along with the combustion-supporting gas. To this end, the silicon-providing reactant gas, titanium-providing reactant gas, and combustion-supporting gas are preferably pre-mixed and made uniform in composition through a line mixer or the like.

The burner used in the preparation of titania-doped quartz glass preferably comprises a central multi-fold tube section and a multi-nozzle section. The central multi-fold tube section includes a reactant gas injecting nozzle at the center and a plurality of concentrically arranged nozzles. The plurality of nozzles receive combustion-supporting gas or combustible gas. On the other hand, the multi-nozzle section includes small-diameter nozzles arranged in rows concentric with respect to the central reactant gas injecting nozzle for injecting combustion-supporting gas and a space outside the small-diameter nozzles for injecting combustible gas.

Figure 3:
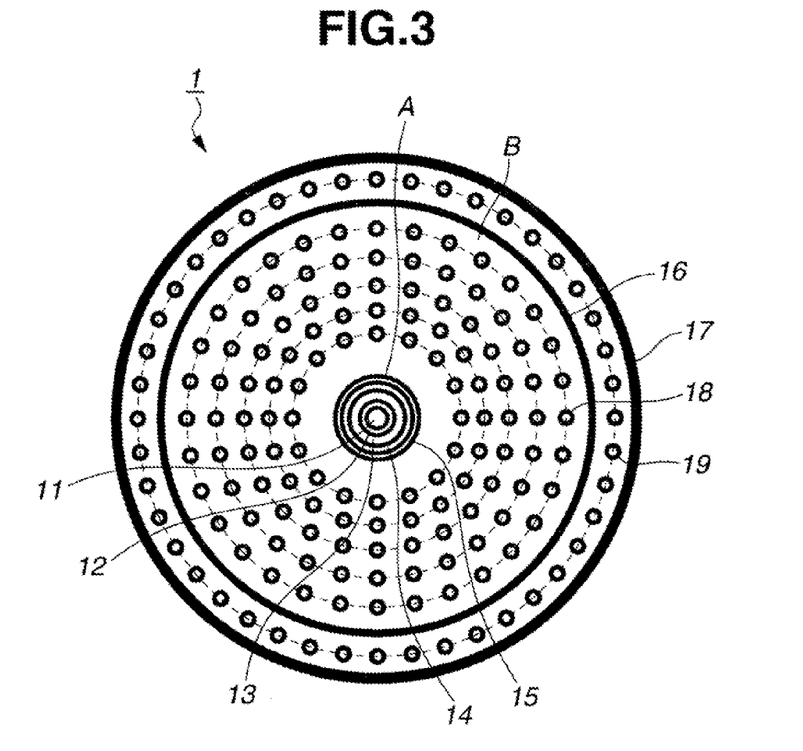
FIG. 3 is a transverse cross-sectional view of gas injection nozzles of a burner for the manufacture of titania-doped quartz glass used in Examples.

Specifically, the preferred burner is of the structure shown in FIG. 3. The burner 1 is illustrated in FIG. 3 as comprising a central multi-fold tube section A at the center and a multi-nozzle section B enclosing section A. The central multi-fold tube section A includes a central tube (or nozzle) 11 for injecting reactant gases, a first combustion-supporting gas feed tube 12 enclosing the central tube 11, a first combustible gas feed tube 13 enclosing the tube 12, a second combustion-supporting gas feed tube 14 enclosing the tube 13, and a second combustible gas feed tube 15 enclosing the tube 14, in a concentric telescopic arrangement. The multi-nozzle section B includes a first shell 16 disposed outside and enclosing the second combustible gas feed tube 15, and a second shell 17 disposed outside and enclosing the first shell 16. A multiplicity of third combustion-supporting gas feed tubes 18 are disposed between the second combustible gas feed tube 15 and the first shell 16, in five rows concentric with the central tube 11 while combustible gas is fed through the remaining space within the first shell 16 (outside third combustion-supporting gas feed tubes 18). A multiplicity of fourth combustion-supporting gas feed tubes 19 are disposed between the first and second shells 16 and 17 in a concentric row while combustible gas is fed through the remaining space within the second shell 17 (outside fourth combustion-supporting gas feed tubes 19).

In the preparation of titania-doped quartz glass according to the invention, the central multi-fold tube section A of the burner preferably includes at least three tubes, and more preferably at least five tubes. A burner having a central multi-fold tube section consisting of less than three tubes tends to produce a broader distribution of absorption edge wavelength, with the absorption edge wavelength deviating from the range. In order to provide the molten face during ingot growth with an appropriate shape, a multiplicity of third combustion-supporting gas feed tubes 18 in the multi-nozzle section B are disposed preferably in five rows, more preferably in six rows concentric with the central multi-fold tube. The arrangement of combustion-supporting gas feed tubes in five or six rows ensures that the molten face during ingot growth maintains an appropriate shape.

It is not recommended during manufacture of a titania-doped quartz glass ingot that the ingot be oscillated in a plane perpendicular to the growth axis direction. It is also not recommended to use a plurality of quartz glass manufacturing burners and to feed the reactant gases to the ingot molten face at a plurality of positions. This is because otherwise, the titania concentration distribution in the ingot may be broadened, strong striae may be generated, and the birefringence fast axis distribution in the EUV light-reflecting surface may be made concentric with difficulty.

In the method for the preparation of titania-doped quartz glass, oxygen gas as the combustion-supporting gas and hydrogen gas as the combustible gas are fed through the multi-nozzle section and the central multi-fold tube section of the burner. Preferably, oxygen in excess of the stoichiometry, specifically in the range: $1.7 \leq H_2/O_2$ ratio<2, is available in at least one, more preferably both of the multi-nozzle section and the central multi-fold tube section. If hydrogen in excess of the stoichiometry (specifically $H_2/O_2$ ratio$\geq 2$) is available in both the multi-nozzle section and the central multi-fold tube section, then the distribution of absorption edge wavelength at an apparent transmittance per 5-mm thickness may often exceed 10 nm and the absorption edge wavelength at an apparent transmittance per 5-mm thickness may often fall outside the range of 270 nm to 320 nm.

In another preferred embodiment, the combustible gas, typically hydrogen gas is injected through the burner at a linear velocity of less than or equal to 100 m/sec, more preferably less than or equal to 90 m/sec. If the linear velocity of hydrogen gas injected as the combustible gas through the burner is higher than 100 m/sec, the titania-doped quartz glass prepared under such conditions tends to experience an increase of standard deviation of birefringence in the EUV light-reflecting surface, a substantial reduction of the OH group concentration upon 900° C./100-hr heat treatment, and a lowering of apparent transmittance per 5-mm thickness at 350 to 800 nm, and have a broader distribution of absorption edge wavelength, which lead to the risk of thermal hysteresis on use as the EUV lithography member. The linear velocity of the combustible gas, typically hydrogen gas is usually at least 0.5 m/sec, and preferably at least 1 m/sec though the lower limit is not critical.

The prior art knowledge about the preparation of titania-doped quartz glass has not considered the distance between the burner tip and the growth front of the ingot during the process (to be referred to as "burner distance") and the angle between the ingot growth axis and the axis of the burner's reactant feed nozzle, i.e., the nozzle axis of reactant gas-feeding central tube (to be referred to as "burner angle") as the factor of governing the physical properties of titania-doped quartz glass being prepared. It has been found that the burner distance and the burner angle are important in inhibiting formation of structural defects which alter the absorption edge wavelength of titania-doped quartz glass and must be different from those used in the preparation of undoped quartz glass.

Figure 4:
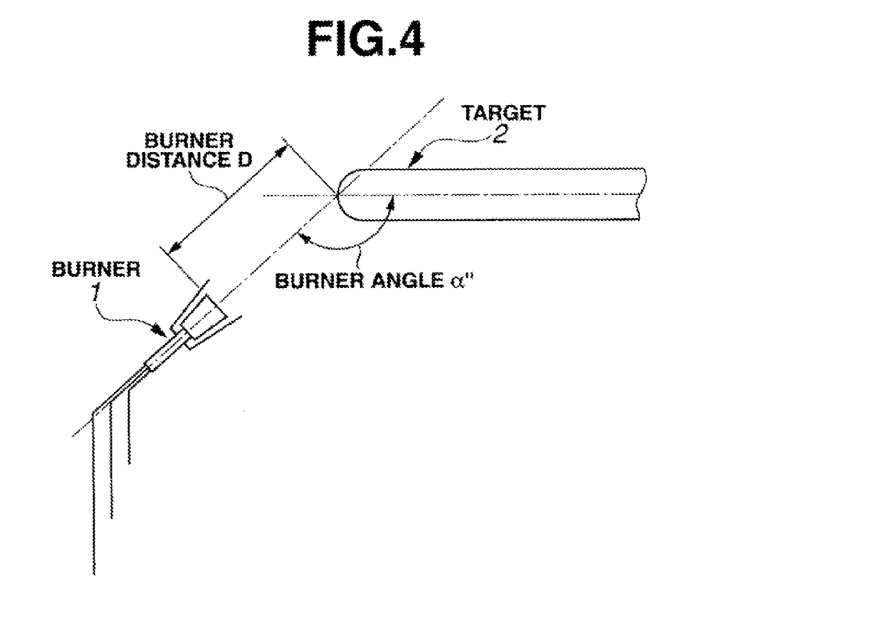
FIG. 4 is a schematic view of a burner and a target, illustrating a burner angle and distance relative to the target.

Referring to FIG. 4, a burner 1 is positioned relative to a target or ingot 2. The burner 1 and the growth front of ingot 2 growing on the target are spaced a distance D and oriented to include an angle α" therebetween. The burner distance D is preferably at least 250 mm, more preferably at least 265 mm, which distance is at least 1.2 times longer than the distance used in the preparation of undoped quartz glass. This is because reactions of reactant gases takes a sufficiently long time to restrain generation of structural defects, as compared with the preparation of undoped quartz glass. The burner distance D is typically up to 330 mm. A burner distance D of more than 330 mm may make it difficult to maintain an optimum temperature for ingot growth and to maintain a molten face shape sufficient to produce titania-doped quartz glass having a concentric distribution of birefringence fast axis in the EUV light-reflecting surface.

In a preferred embodiment, the burner angle α" is at least 126°, and more preferably at least 128°. While a burner angle of less than or equal to 125° is generally employed in the preparation of undoped quartz glass, the embodiment of the invention recommends growth at a greater burner angle. Maintaining a burner angle α" of at least 126° ensures the uniformity of growth face temperature, making it possible to prepare a titania-doped quartz glass with a minimized distribution of absorption edge wavelength, a absorption edge wavelength in the desired range, and a reduced distribution of fictive temperature. The burner angle α" is typically up to 140° in view of the productivity of titania-doped quartz glass.

The silicon-providing reactant gas used herein may be selected from well-known organosilicon compounds, for example, silicon tetrachloride, chlorosilanes such as dimethyldichlorosilane and methyltrichlorosilane, and alkoxysilanes such as tetramethoxysilane, tetraethoxysilane, and methyltrimethoxysilane.

The titanium-providing reactant gas used herein may also be selected from well-known compounds, for example, titanium halides such as titanium tetrachloride and titanium tetrabromide, and titanium alkoxides such as tetraethoxytitanium, tetraisopropoxytitanium, tetra-n-propoxytitanium, tetra-n-butoxytitanium, tetra-sec-butoxytitanium, and tetra-t-butoxytitanium.

On the other hand, the combustible gas used herein may be hydrogen or hydrogen-containing gas, optionally in combination with another gas such as carbon monoxide, methane or propane. The combustion-supporting gas used herein may be oxygen or oxygen-containing gas.

In a preferred embodiment, the titania-doped quartz glass thus obtained is subjected to homogenization. Homogenization may be performed by the method of JP-A H08-333125, for example. The homogenization is effective for further increasing the average value of the angle (θ) included between a straight line connecting an origin (O) at the center of the EUV light-reflecting surface to a birefringence measurement point (A) and a fast axis of birefringence at the measurement point (A). However, a concentric distribution of birefringence fast axis in the EUV light-reflecting surface is not achievable by homogenization of titania-doped quartz glass alone, because it is essential to produce a titania-doped quartz glass ingot under the above-defined conditions (especially to maintain the molten face of the ingot in an oblong shape having a major axis aligned with the growth axis direction of the ingot during manufacture).

In order that the titania-doped quartz glass ingot be shaped into a desired shape suited for a particular EUV lithography member such as a mirror, stage or photomask substrate, it is hot shaped at a temperature of 1,500 to 1,800° C. for 1 to 10 hours. Preferably hot shaping is conducted such that the axis of the shape is parallel to the growth axis of the titania-doped quartz glass grown in the manufacture furnace. Where homogenization is performed, hot shaping is preferably conducted such that the axis of the shape is parallel to the rotational axis of the ingot during homogenization in order to achieve a concentric distribution of birefringence fast axis in the EUV light-reflecting surface and to reduce the birefringence and its standard deviation.

After the hot shaping, the titania-doped quartz glass may be annealed and slowly cooled. Annealing may be conducted under well-known conditions, for example, by holding at a temperature of 700 to 1,300° C. in air for 1 to 200 hours. This is followed by slow cooling, typically to about 500° C. Preferably the glass is slowly cooled to or below 300° C., more preferably to or below 200° C., in order to achieve a concentric distribution of birefringence fast axis in the EUV light-reflecting surface, to reduce the birefringence and its standard deviation, and to reduce the fictive temperature and its distribution. The cooling rate is typically 1 to 20° C./hr, preferably 1 to 10° C./hr.

After the annealing/slow cooling treatment, the titania-doped quartz glass is processed into a predetermined size by machining or slicing and then polished by a double-side lapping machine with an abrasive such as silicon oxide, aluminum oxide, molybdenum oxide, silicon carbide, diamond, cerium oxide or colloidal silica, thereby forming an EUV lithography member. From the titania-doped quartz glass, in the case of 6-inch square glass substrates, for example, EUV lithography photomask substrates can be efficiently formed in which the difference between the highest and the lowest positions (also referred to as peak-to-valley (P-V) flatness) within a central region of 142.4 mm×142.4 mm squares in either one or both of the substrate surfaces as polished is up to 50 nm, preferably up to 40 nm, and more preferably up to 30 nm. It is noted that the P-V flatness may be determined by UltraFlat M200 (TROPEL).

A substrate of the titania-doped quartz glass manufactured by the invention having front and back surfaces is character-ized by a high surface flatness because surface asperities caused by striae are not formed on the front and back surfaces. The substrate is fully homogeneous, indicating that recessed defects having a size in excess of 60 nm as measured at their broadest position are absent in a central region of 142.4 mm×142.4 mm squares on the substrate surface after polishing and cleaning. Preferably recessed defects having a size in excess of 50 nm, more preferably in excess of 40 nm, and even more preferably in excess of 30 nm as measured at their broadest position are absent in a central region of 142.4 mm×142.4 mm squares on the substrate surface. The recessed defects may be detected by sputter forming a film of five Si—Mo reflecting layers on a titania-doped quartz glass substrate as polished and cleaned, using EUV light of wavelength 13.5 nm as the light source, focusing the light at the surface of an EUV lithography photomask substrate through a Schwarzschild optical system, and observing in the dark field. The glass substrate is thermal stress cut at the defect detection point, whereby the shape and position of the defect are acknowledged.

In order that the standard deviation of birefringence in the EUV light-reflecting surface, the maximum of birefringence, the fictive temperature, and the fictive temperature distribution of titania-doped quartz glass fall in their desired ranges, a titania-doped quartz glass ingot is prepared under the preferred conditions that the flow rates of the combustible gas, the combustion-supporting gas, the silicon-providing reactant gas and the titanium-providing reactant gas are controlled so that respective variations of the flow rates may fall within ±1%, the temperatures of cooling air flowing into the furnace, exhaust gas from the furnace, and ambient air surrounding the furnace are controlled so that respective variations of the temperatures may fall within ±2.5° C., and the target is rotated at a rotational speed of at least 5 rpm when the titania-doped quartz glass is grown on the rotating target.

When the titania-doped quartz glass ingot thus prepared is hot shaped, the ingot is preferably treated in a shaping crucible such that the ingot may not buckle or lean on the crucible during hot shaping.

After the hot shaping, the titania-doped quartz glass is annealed and slowly cooled for reducing the birefringence and fictive temperature. The annealing and slow cooling conditions are as described above. To further control the fictive temperature distribution, the thickness of titania-doped quartz glass subject to annealing and slow cooling is preferably up to 10 cm, more preferably up to 5 cm, and even more preferably up to 1 cm.

EXAMPLE

Examples and Comparative Examples are given below for illustrating the invention although the invention is not limited thereto.

Examples 1 and 3

A titania-doped quartz glass ingot was prepared by using a horizontal furnace including a quartz burner as shown in FIG. 3, feeding gases ($SiCl_4$, $TiCl_4$, $O_2$, $H_2$) to respective nozzles of the burner as shown in Table 1, forming an oxyhydrogen flame, effecting oxidation or flame hydrolysis of silicon tetrachloride and titanium tetrachloride in the oxyhydrogen flame to produce $SiO_2$ and $TiO_2$, depositing silica and titania fine particles on a target, and concurrently melting and vitrifying the particles. The target was disposed forward of the burner, rotated at 50 rpm, and retracted at 10 mm/hr. The burner and the target were relatively set at a burner distance and a burner angle as shown in Table 1. Table 1 also reports a linear velocity of hydrogen gas flows in the central multi-fold tube section and the multi-nozzle section under the process conditions. The flow rates of respective gases were kept at a variation of ±0.2%. Also the temperatures of inlet air to the furnace, exhaust gas from the furnace, and ambient air around the furnace were kept at a variation of ±1° C. The shape of the molten face sector of the titania-doped quartz glass ingot at the end of preparation was measured, with the result shown in Table 4.

The resulting ingot had a diameter of 110 mm and a length of 400 mm. A disk sample of 6.5 mm thick was sliced from the ingot, ground, polished and cleaned on opposite surfaces, providing a sample of 5.01 mm thick. The sample was measured for apparent transmittance at wavelength 350 to 800 nm and OH group concentration at positions radially spaced apart from the center at intervals of 20 mm.

The remaining titania-doped quartz glass ingot was hot shaped into a square column of 160 mm×160 mm by heating at 1700° C. for 6 hours. The column was sliced into substrates of 7 mm thick. The substrates were annealed in a furnace lined with high-purity porous silicon carbide insulator by holding in air at 850° C. for 150 hours and then slowly cooled at a rate of 2° C./hr to 200° C. The substrates were ground to a square shape of 152.4 mm×152.4 mm and polished for 6 hours by a double-side lapping machine Model 12B (Fujikoshi Machinery Corp.) using a suede-type polishing pad and cerium oxide abrasive and then for 1 hour using colloidal silica abrasive instead. Cleaning resulted in polished substrates of 6.35 mm thick having both surfaces mirror finished.

Figure 5:
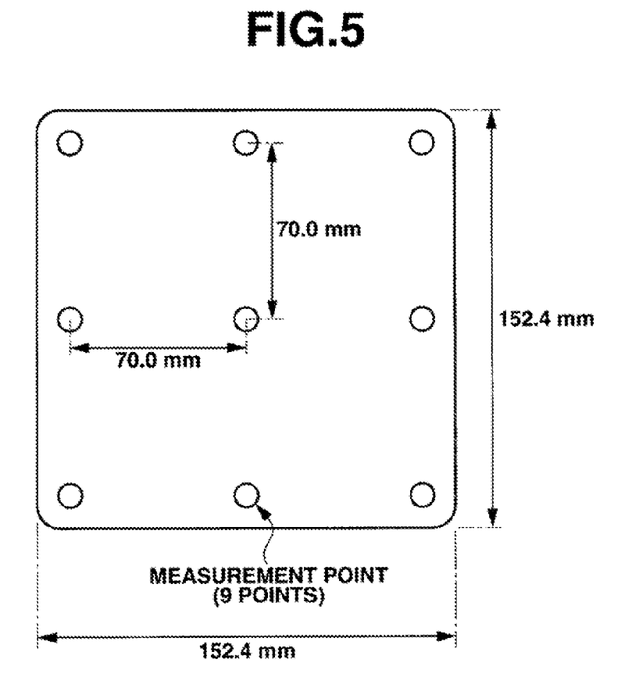
FIG. 5 is a plan view of a glass sample, showing points of measurement of physical properties.
Figure 7:
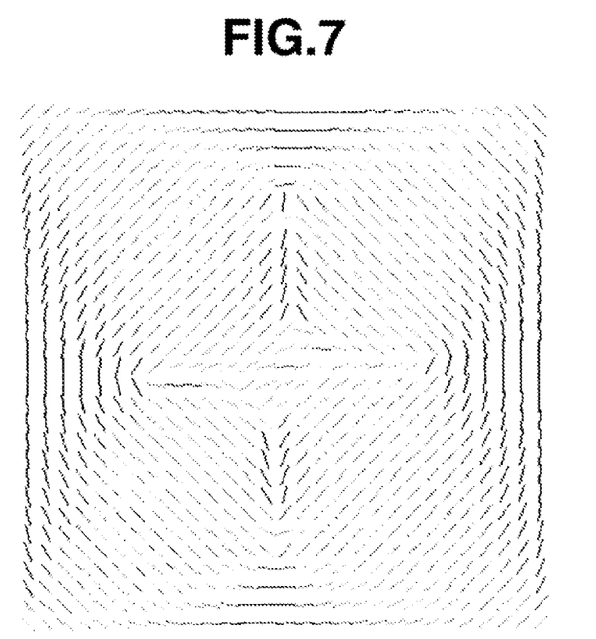
FIG. 7 is a diagram showing the distribution of fast axes of birefringence in the EUV light-reflecting surface of a titania-doped quartz glass substrate manufactured in Example 1.

One polished substrate was measured for birefringence at points spaced apart 5 mm and for fast axis at each point in a region of 152.4 mm×152.4 mm squares. The substrate was also measured for fictive temperature and titania concentration at nine positions as shown in FIG. 5. Twenty (20) similarly polished substrates were measured for flatness on opposite surfaces. The measurement results of these physical properties are tabulated in Table 4. It is noted that the measurement result of flatness is expressed as a percent acquisition of those substrates meeting a flatness of up to 50 nm, up to 40 nm, or up to 30 nm among 20 polished substrates. FIG. 7 diagrammatically illustrates the birefringence distribution of the polished substrate.

Example 2

Figure 8:
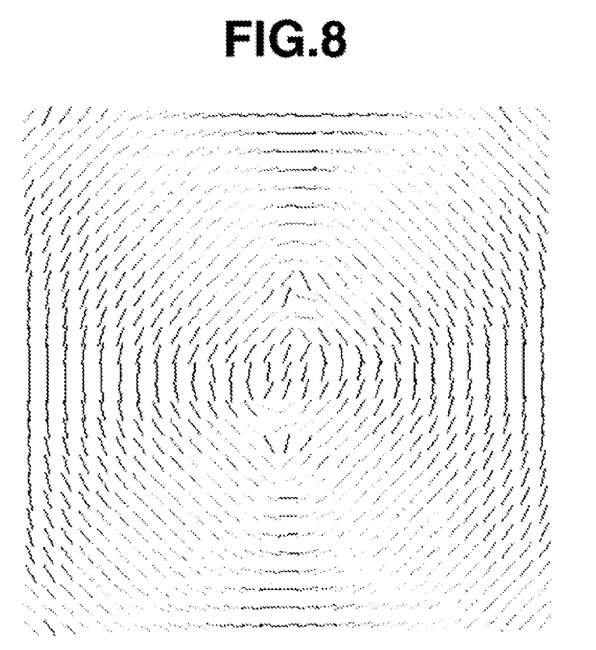
FIG. 8 is a diagram showing the distribution of fast axes of birefringence in the EUV light-reflecting surface of a titania-doped quartz glass substrate manufactured in Example 2.

A titania-doped quartz glass ingot of 110 mm diameter and 400 mm length was prepared as in Example 1. After slicing of a sample for apparent transmittance and OH group concentration measurements and prior to hot shaping, the ingot was homogenized by the method of JP-A H08-333125, obtaining a titania-doped quartz glass ingot which was homogeneous in three directions. Specifically, a burner was slowly moved over the ingot along a rotational axis at a speed of 20 mm/min to create a molten zone so that the molten zone might eventually pass throughout the cylindrical quartz glass ingot. Otherwise, processing and measurement were as in Example 1. The results are also tabulated in Table 4. FIG. 8 diagrammatically illustrates the birefringence distribution of the polished substrate.

Example 4

A titania-doped quartz glass ingot was prepared as in Example 1 except that the flow rate of hydrogen gas was intentionally varied every 30 minutes in a range of ±3% from the preset flow rate. The results are also tabulated in Table 4.

Example 5

Sample preparation was the same as in Example 1 except that glass substrates were slowly cooled at a rate of 30° C./hr to 200° C. The results are also tabulated in Table 4.

Example 6

Sample preparation was the same as in Example 1 except that glass substrates were annealed at 1150° C. in a furnace lined with high-purity porous silicon carbide insulator and then slowly cooled at a rate of 20° C./hr to 200° C. The results are also tabulated in Table 4.

Comparative Example 1

Figure 6:
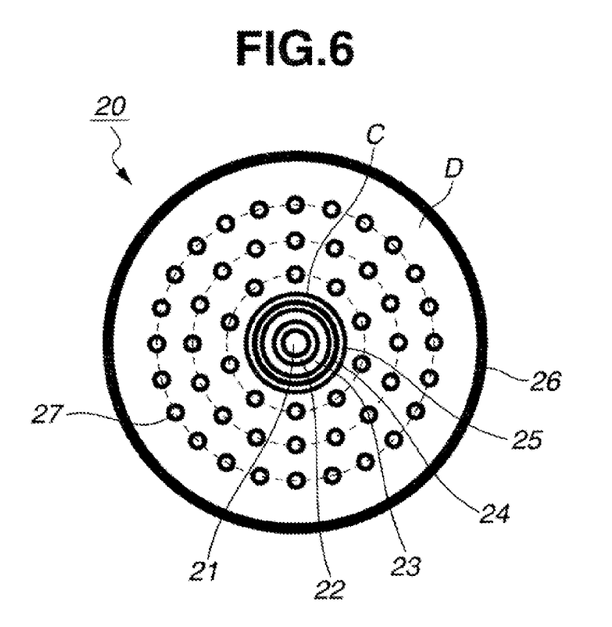
FIG. 6 is a transverse cross-sectional view of gas injection nozzles of a burner for the manufacture of titania-doped quartz glass used in Comparative Example 1.
Figure 9:
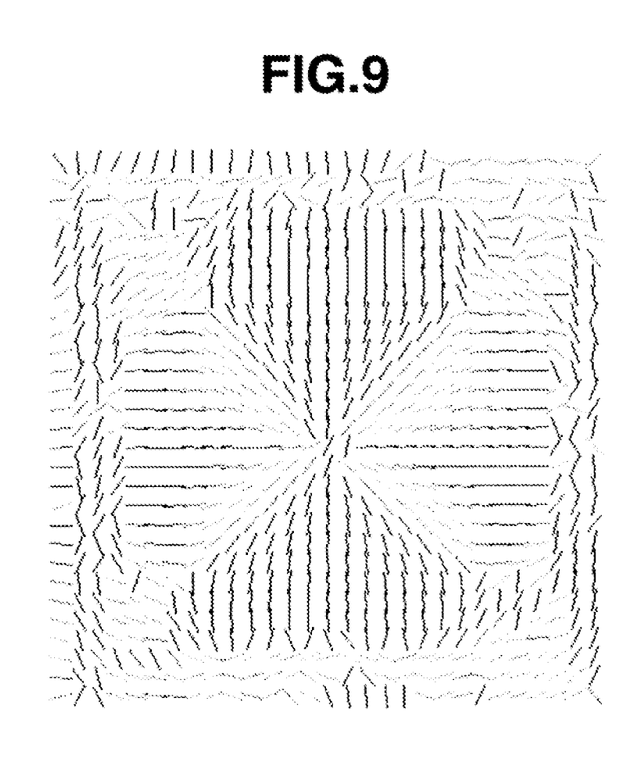
FIG. 9 is a diagram showing the distribution of fast axes of birefringence in the EUV light-reflecting surface of a titania-doped quartz glass substrate manufactured in Comparative Example 1.

A titania-doped quartz glass ingot was prepared by using a burner as shown in FIG. 6 and gases as shown in Table 2. The burner 20 in FIG. 6 includes a central multi-fold tube section C at the center and a multi-nozzle section D enclosing section C. The central multi-fold tube section C includes a central tube (or nozzle) 21 for injecting reactant gases, a first combustion-supporting gas feed tube 22 enclosing the tube 21, a first combustible gas feed tube 23 enclosing the tube 22, a second combustion-supporting gas feed tube 24 enclosing the tube 23, and a second combustible gas feed tube 25 enclosing the tube 24, in a concentric telescopic arrangement. The multi-nozzle section D includes a shell 26 disposed outside and enclosing the second combustible gas feed tube 25. A multiplicity of third combustion-supporting gas feed tubes 27 are disposed between the second combustible gas feed tube 25 and the shell 26, in three rows concentric with the central tube 21 while combustible gas is fed through the remaining space within the shell 26 (outside third combustion-supporting gas feed tubes 27). Otherwise, titania-doped quartz glass was prepared as in Example 1. The results are also tabulated in Table 4. FIG. 9 diagrammatically illustrates the birefringence distribution of the polished substrate.

Comparative Example 2

A titania-doped quartz glass ingot was prepared by using a burner as shown in FIG. 10 and described in JP-A 2010-013335. The burner has a combustion-supporting gas feed nozzle of dual tubes in a multi-nozzle section. Other preparation conditions are shown in Table 3.

Figure 10A:
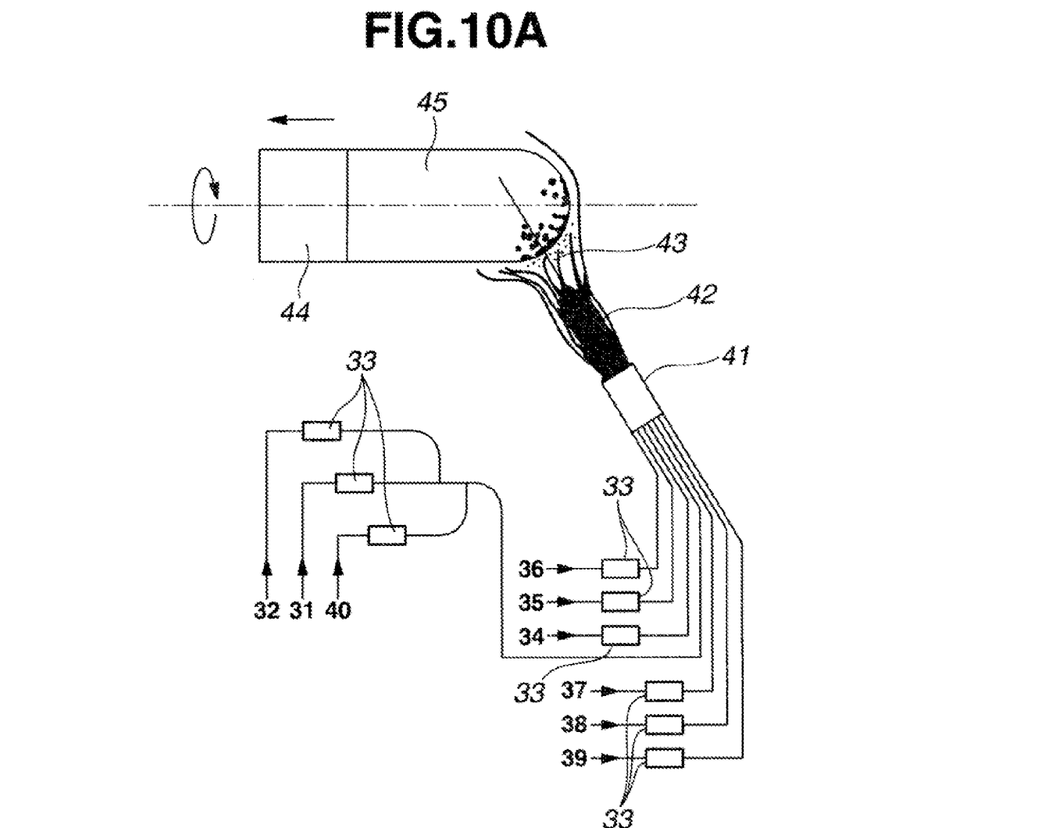
Figure 10B:
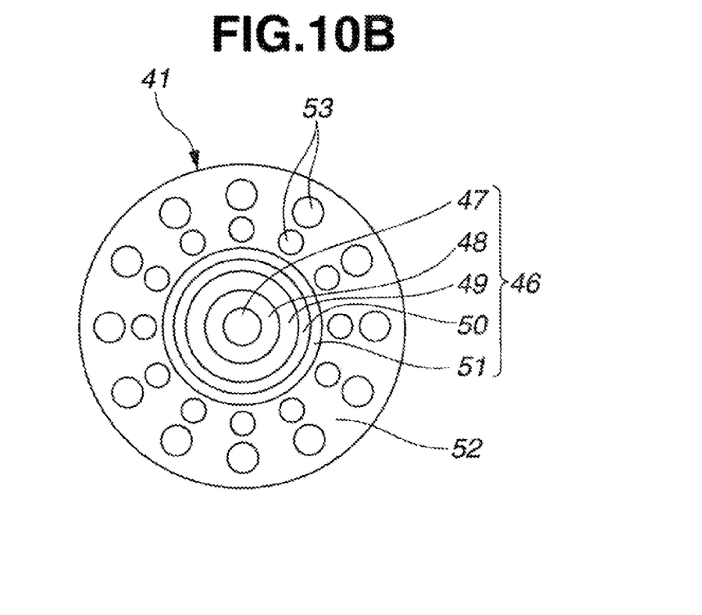

The titania-doped quartz glass manufacture system illustrated in FIG. 10a includes a $SiCl_4$ feed line 31, a $TiCl_4$ feed line 32, flow meters 33, hydrogen gas feed lines 34 to 36, oxygen gas feed lines 37 to 40, a quartz main burner 41 for producing an oxyhydrogen flame 42 and titania-doped silica fine particles 43, and a support or target 44 on which an ingot 45 is grown. FIG. 10b is a transverse cross-section of burner 41, including a five-fold tube 46 consisting of five nozzles 47 to 51, an outer shell 52 outside tube 46, and nozzles 53 inside outer shell 52. The central or first nozzle 47 receives $SiCl_4$ and $TiCl_4$ from the $SiCl_4$ and $TiCl_4$ feed lines 31 and 32 and oxygen gas from the oxygen gas feed line 40. An inert gas such as argon gas may also be fed if desired. The second and fourth nozzles 48 and 50 receive oxygen gas from the oxygen gas feed lines 37 and 38, and the third and fifth nozzles 49 and 51 receive hydrogen gas from the hydrogen gas feed lines 34 and 35. The outer shell 52 receives hydrogen gas from the hydrogen gas feed line 36, and the nozzle 53 receives oxygen gas from the oxygen gas feed line 39.

An ingot of titania-doped quartz glass was prepared by feeding the gases shown in Table 3 to the respective nozzles of the main burner, forming an oxyhydrogen flame, effecting hydrolytic reaction of silicon tetrachloride and titanium tetrachloride in the oxyhydrogen flame to produce $SiO_2$ and $TiO_2$, depositing titania-doped silica fine particles on a target disposed forward of the burner, and continuing growth. The target was rotated at 50 rpm and retracted at 10 mm/hr. In addition to the main burner, a sub-burner (not shown) was used to apply an oxyhydrogen flame to the side surface of the ingot. The flow rates of different gases were kept within a variation of ±0.2%/hr. During preparation of titania-doped quartz glass in the manufacture furnace, the temperatures of air to the furnace, exhaust gas from the furnace and ambient air around the furnace were kept within a variation of ±1° C.

The resulting ingot of 120 mm diameter and 400 mm length was placed in a columnar crucible having a square bottom of 155 mm×155 mm such that the ingot was aligned with the intersection between diagonals on the square crucible bottom. In an electric furnace having a temperature gradient of 2.5° C./cm at 1,700° C., the ingot was hot shaped by heating at 1,700° C. for 6 hours. During hot shaping, the crucible was rotated at 2 rpm. Thereafter, the ingot was held in air at 1,150° C. for 150 hours for annealing, and slowly cooled down to 500° C. at a rate of 5° C./hr. The ingot as annealed was machined to a square prism of 152.4 mm×152.4 mm, obtaining a titania-doped quartz glass ingot. Otherwise, processing and measurement were as in Example 1. The results are also tabulated in Table 4.

TABLE 1

| | | Gas | Cross-sectional area, mm² | Gas flow rate, Nm³/hr (hydrogen gas linear velocity, m/sec) | | |
|---|---|---|---|---|---|---|
| | | | | Example 1, 2, 4, 5 | Example 3 | Example 6 |
| Central multi-fold tube section | 1st tube | $SiCl_4$ | 12.56 | 1420 g/hr | 1420 g/hr | 1420 g/hr |
| | | $TiCl_4$ | | 190 g/hr | 170 g/hr | 190 g/hr |
| | | $O_2$ | | 2.02 | 2.02 | 2.02 |
| | 2nd tube | $O_2$ | 21.27 | 0.60 | 0.60 | 0.60 |
| | 3rd tube | $H_2$ | 49.46 | 15.00 (84.2) | 19.00 (106.7) | 15.00 (84.2) |
| | 4th tube | $O_2$ | 37.18 | 9.00 | 8.50 | 9.00 |
| | 5th tube | $H_2$ | 37.04 | 5.20 (39) | 5.00 (37.5) | 5.20 (39) |

TABLE 1-continued

| | | Gas | Cross-sectional area, mm² | Gas flow rate, Nm³/hr (hydrogen gas linear velocity, m/sec) | | |
|---|---|---|---|---|---|---|
| | | | | Example 1, 2, 4, 5 | Example 3 | Example 6 |
| Multi-nozzle section | Inside nozzles | $O_2$ | 241.15 | 12.50 | 12.00 | 12.50 |
| | Inside shell | $H_2$ | 6161 | 25.00 (1.1) | 23.00 (1) | 25.00 (1.1) |
| | Outside nozzles | $O_2$ | 88.42 | 5.00 | 5.00 | 5.00 |
| | Outside shell | $H_2$ | 2286 | 6.00 (0.7) | 6.00 (0.7) | 6.00 (0.7) |
| Burner distance, mm | | | | 280 | 260 | 320 |
| Burner angle, ° | | | | 128 | 132 | 126 |

TABLE 2

| | | Gas | Cross-sectional area, mm² | Gas flow rate, Nm³/hr (hydrogen gas linear velocity, m/sec) Comparative Example 1 |
|---|---|---|---|---|
| Central multi-fold tube section | 1st tube | $SiCl_4$ | 10.75 | 1420 g/hr |
| | | $TiCl_4$ | | 200 g/hr |
| | | $O_2$ | | 2.02 |
| | 2nd tube | $O_2$ | 16.68 | 0.60 |
| | 3rd tube | $H_2$ | 51.55 | 16.00 (86.2) |
| | 4th tube | $O_2$ | 21.04 | 9.50 |
| | 5th tube | $H_2$ | 15.07 | 5.00 (92.2) |
| Multi-nozzle section | Nozzles | $O_2$ | 100.48 | 15.00 |
| | Shell | $H_2$ | 2703 | 29.00 (3) |
| Burner distance, mm | | | | 285 |
| Burner angle, ° | | | | 128 |

TABLE 3

| | | Gas | Cross-sectional area, mm² | Gas flow rate, Nm³/hr (hydrogen gas linear velocity, m/sec) Comparative Example 2 |
|---|---|---|---|---|
| Central multi-fold tube section | 1st tube | $SiCl_4$ | 10.75 | 1250 g/hr |
| | | $TiCl_4$ | | 150 g/hr |
| | | $O_2$ | | 2.00 |
| | 2nd tube | $O_2$ | 11.34 | 1.00 |
| | 3rd tube | $H_2$ | 58.54 | 15.00 (71.2) |
| | 4th tube | $O_2$ | 55.25 | 8.00 |
| | 5th tube | $H_2$ | 32.12 | 10.00 (86.5) |
| Multi-nozzle section | Nozzles | $O_2$ | 80.65 | 10.00 |
| | Shell | $H_2$ | 3103 | 20.00 (1.8) |
| Burner distance, mm | | | | 240 |
| Burner angle, ° | | | | 124 |

TABLE 4

| | | Example | | | | | | Comparative Example | |
|---|---|---|---|---|---|---|---|---|---|
| | | 1 | 2 | 3 | 4 | 5 | 6 | 1 | 2 |
| Molten face shape | 1−(b/a) | 0.49 | 0.49 | 0.49 | 0.5 | 0.48 | 0.38 | 0.2 | 0.24 |
| θ | Average value (°) | 75.6 | 83.2 | 68.5 | 71.1 | 72.1 | 49.2 | 37.1 | 41.6 |
| | Standard deviation (°) | 16.1 | 8.7 | 12.4 | 10.2 | 9.8 | 10.6 | 27.6 | 23.4 |
| Birefringence | Standard deviation (nm/cm) | 2.1 | 1.6 | 6 | 4.8 | 3.2 | 4.1 | 6.7 | 3.1 |
| | Maximum (nm/cm) | 4.1 | 3.6 | 9.9 | 12.7 | 8.6 | 9.2 | 12.5 | 4.6 |

TABLE 4-continued

|  |  | Example | | | | | | Comparative Example | |
|---|---|---|---|---|---|---|---|---|---|
|  |  | 1 | 2 | 3 | 4 | 5 | 6 | 1 | 2 |
| Fictive temperature | Maximum (° C.) | 768 | 765 | 782 | 783 | 821 | 902 | 795 | 783 |
|  | Minimum (° C.) | 765 | 763 | 776 | 770 | 793 | 826 | 788 | 778 |
| Fictive temperature distribution (° C.) |  | 3 | 2 | 6 | 13 | 28 | 76 | 7 | 5 |
| OH group concentration | Maximum (ppm) | 502 | 536 | 604 | 552 | 582 | 618 | 440 | 502 |
|  | Minimum (ppm) | 450 | 492 | 502 | 481 | 541 | 415 | 408 | 470 |
|  | Average (ppm) | 471 | 507 | 521 | 502 | 561 | 495 | 420 | 481 |
| Absorption edge wavelength | Maximum (nm) | 282 | 283 | 289 | 286 | 282 | 285 | 284 | 282 |
|  | Minimum (nm) | 281 | 282 | 283 | 283 | 280 | 281 | 281 | 281 |
| $TiO_2$ concentration | Maximum (wt %) | 6.9 | 6.8 | 7.1 | 7.0 | 6.9 | 6.9 | 6.9 | 6.9 |
|  | Minimum (wt %) | 6.8 | 6.8 | 6.5 | 6.7 | 6.7 | 6.7 | 6.6 | 6.7 |
| Absorption edge wavelength distribution (nm) |  | 1 | 1 | 6 | 3 | 2 | 4 | 3 | 1 |
| Apparent transmittance at 350-800 nm (minimum, %) |  | 92 | 92 | 87 | 81 | 90 | 91 | 92 | 92 |
| Flatness on one surface ≤50 nm | Acquisition (%) | 85 | 90 | 80 | 65 | 80 | 65 | 30 | 40 |
| Flatness on one surface ≤40 nm | Acquisition (%) | 70 | 80 | 70 | 55 | 70 | 50 | 15 | 20 |
| Flatness on one surface ≤30 nm | Acquisition (%) | 65 | 70 | 50 | 45 | 65 | 40 | 0 | 0 |
| Flatness on both surfaces ≤50 nm | Acquisition (%) | 70 | 75 | 65 | 50 | 70 | 50 | 10 | 30 |
| Flatness on both surfaces ≤40 nm | Acquisition (%) | 55 | 60 | 50 | 30 | 50 | 35 | 0 | 5 |
| Flatness on both surfaces ≤30 nm | Acquisition (%) | 45 | 50 | 40 | 20 | 40 | 20 | 0 | 0 |

Japanese Patent Application No. 2011-087099 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a titania-doped quartz glass, comprising the steps of subjecting a feed of a silicon-providing reactant gas and a titanium-providing reactant gas to oxidation or flame hydrolysis with the aid of a combustible gas and a combustion-supporting gas by using a burner, to form synthetic silica-titania fine particles, depositing the silica-titania fine particles on a rotating target, and concurrently melting and vitrifying the particles to form a titania-doped quartz glass ingot, wherein during the ingot formation, the molten face of the ingot is maintained in an oblong shape having a major axis aligned with the growth axis direction of the ingot so that a molten face sector of the ingot has a length "a" in the growth axis direction of the ingot and a radius "b" in a radial direction of the ingot perpendicular to the growth axis direction, which meet the relationship: 0.3<1−(b/a) <0.67, and wherein said burner comprises a central multi-fold tube section A including at least three tubes at the center and a multi-nozzle section B enclosing section A, a multiplicity of combustion-supporting gas feed tubes in the multi-fold tube section B being disposed in five or six rows concentric with the central multi-fold tube.

2. A method for manufacturing a titania-doped quartz glass using a horizontal furnace comprising a burner, the burner comprising a central multi-fold tube section including at least three tubes, a reactant gas injecting central tube, a first combustion-supporting gas feed tube outside the central tube, and a first combustible gas feed tube outside the first combustion-supporting gas feed tube, and a multi-nozzle section including a first shell tube enclosing the central multi-fold tube section, a second shell tube enclosing the first shell tube, and a plurality of combustion-supporting gas feed tubes disposed inside the first and second shell tubes, the spaces surrounding the combustion-supporting gas feed tubes serving as combustible gas feeder, said method comprising the steps of subjecting a silicon-providing reactant gas and a titanium-providing reactant gas to oxidation or flame hydrolysis with the aid of a combustible gas and a combustion-supporting gas, to form silica and titania fine particles, depositing the silica and titania fine particles on a rotating target, concurrently melting and vitrifying the particles to form a titania-doped quartz glass ingot, wherein the silicon-providing reactant gas, the titanium-providing reactant gas, and the combustion-supporting gas are fed through the reactant gas injecting central tube in such amounts that the titania-doped quartz glass may have a titania content of 3 to 10% by weight, the combustible gas is fed at a linear velocity of less than or equal to 100 m/sec, and the combustible gas and the combustion-supporting gas are fed in such amounts that a $H_2/O_2$ ratio may fall in the range: 1.7≤$H_2/O_2$<2, wherein the flow rates of the combustible gas, the combustion-supporting gas, the silicon-providing reactant gas, and the titanium-providing reactant gas each are controlled within a variation of ±1%, the temperatures of air fed into the furnace for cooling, exhaust gas taken out of the furnace, and ambient air surrounding the furnace each are controlled within a variation of ±2.5° C., the target is rotated at a speed of 5 to 200 rpm without relative oscillation of the burner and the target and without oscillation of the ingot in a plane perpendicular to the growth axis direction, wherein during the ingot formation, the molten face of the ingot is maintained in an oblong shape having a major axis aligned with the growth axis direction of the ingot so that a molten face sector of the ingot has a length "a" in the growth axis direction of the ingot and a radius "b" in a radial direction of the ingot perpendicular to the growth axis direction, which meet the relationship, $0.3<1-(b/a)<0.67$ by adjusting the positional relation between the glass manufacturing burner and the ingot so that the distance between the burner tip and the growth front of the ingot during the process is 250 mm to 330 mm and the angle between the ingot growth axis and the axis of the burner's reactant feed nozzle is 126° to 140°, said method further comprising the steps of hot shaping the ingot, slicing the ingot to a predetermined thickness, and annealing at a cooling rate of 1 to 20° C. to or below 300° C., wherein said burner comprises a central multi-fold tube section A including at least three tubes at the center and a multi-nozzle section B enclosing section A, a multiplicity of combustion-supporting gas feed tubes in the multi-fold tube section B being disposed in five or six rows concentric with the central multi-fold tube.

\* \* \* \* \*